US009961774B2

(12) United States Patent
Supinski

(10) Patent No.: US 9,961,774 B2
(45) Date of Patent: May 1, 2018

(54) WIRELESS COMMUNICATIONS ASSEMBLY

(71) Applicant: Peraso Technologies Inc., Toronto (CA)

(72) Inventor: Marc Supinski, Toronto (CA)

(73) Assignee: PERASO TECHNOLOGIES INC., Toronto (CA)

( * ) Notice: Subject to any disclaimer, the term of this patent is extended or adjusted under 35 U.S.C. 154(b) by 0 days. days.

(21) Appl. No.: 15/010,465

(22) Filed: Jan. 29, 2016

(65) Prior Publication Data
US 2017/0223831 A1  Aug. 3, 2017

(51) Int. Cl.
| | |
|---|---|
| H04B 17/00 | (2015.01) |
| H05K 1/18 | (2006.01) |
| H04B 17/12 | (2015.01) |
| G01R 29/10 | (2006.01) |
| H01Q 1/38 | (2006.01) |
| H01Q 1/50 | (2006.01) |
| H01Q 1/12 | (2006.01) |
| H04B 17/17 | (2015.01) |
| H05K 1/14 | (2006.01) |

(52) U.S. Cl.
CPC ............... *H05K 1/18* (2013.01); *G01R 29/10* (2013.01); *H01Q 1/12* (2013.01); *H01Q 1/38* (2013.01); *H01Q 1/50* (2013.01); *H04B 17/12* (2015.01); *H04B 17/17* (2015.01); *H05K 1/141* (2013.01); *H05K 2201/049* (2013.01); *H05K 2201/10098* (2013.01)

(58) Field of Classification Search
CPC . H05K 1/18; H04B 17/12; H01Q 1/38; H01Q 1/50
USPC ....................................................... 455/115.1
See application file for complete search history.

(56) References Cited

U.S. PATENT DOCUMENTS

2002/0171591 A1* 11/2002 Beard ...................... H01Q 1/24
343/702
2006/0114160 A1   6/2006 Noe
(Continued)

FOREIGN PATENT DOCUMENTS

WO   WO-2015088486 A1   6/2015

OTHER PUBLICATIONS

Extended European Search Report dated Jun. 27, 2017 for European Patent Application No. 17153770.7.

*Primary Examiner* — Raj Chakraborty
(74) *Attorney, Agent, or Firm* — Perry + Currier Inc.

(57) ABSTRACT

A wireless communication assembly includes a first support member carrying a baseband processor and a radio processor, and defining a first mounting surface including a first pair of electrical contacts. The first support member has a first pair of electrical connections between the radio processor and the first electrical contacts. The assembly also includes a second support member carrying an antenna and defining a second mounting surface including a second pair of electrical contacts. The second support member has a second pair of electrical connections between the antenna and the second electrical contacts. The second mounting surface is configured to engage the first mounting surface to rigidly couple the first and second support members and to bring the first pair of electrical contacts into contact with the second pair of electrical contacts for electrically connecting the radio processor and the antenna via the first and second pairs of electrical connections.

14 Claims, 7 Drawing Sheets

(56) References Cited

U.S. PATENT DOCUMENTS

| | | | | |
|---|---|---|---|---|
| 2006/0249754 A1* | 11/2006 | Forman | ............... | H01L 21/6835 257/208 |
| 2008/0122726 A1* | 5/2008 | Levi | ........................ | H01Q 1/38 343/873 |
| 2010/0225539 A1* | 9/2010 | Margomenos | .......... | G01S 7/032 342/373 |
| 2010/0304785 A1* | 12/2010 | Marlett | .................. | H01Q 1/243 455/552.1 |
| 2014/0138804 A1 | 5/2014 | Takizawa et al. | | |

* cited by examiner

WIRELESS COMMUNICATIONS ASSEMBLY

FIELD

The specification relates generally to wireless communications, and specifically to a wireless communications assembly.

BACKGROUND

The performance of wireless antennas (e.g. antenna, dielectric and via geometries in or on printed circuit board assemblies) is known to be dependent on the precision of these geometries. Particularly at higher frequencies—such as those employed by the IEEE 802.11ad standard (also referred to as WiGig), which employs the 60 GHz frequency band—sensitivity of antenna performance to geometry can be very pronounced. As a result, antennas for use in high-frequency applications are often produced with strict manufacturing tolerances. Adhering to such strict design tolerance requirements, however, increase the difficulty (and therefore the cost and time) of production.

In addition to the challenges posed by strict manufacturing tolerances, the complexity required to successfully design, simulate, prototype, and validate high-frequency antennas into productions limits the number of viable antenna solutions that can be produced because of the cost and time associated with the above-mentioned design cycle, particularly when the cycle is repeated to refine the design. This cycle can limit the pace at which new antennas can be developed to meet different high-frequency antenna requirements.

A further complicating factor in the production of wireless radio assemblies for high-frequency applications is the issue of signal attenuation between the antenna and processing circuitry: leads between antenna and processors are generally kept as short as possible to reduce signal losses. Together, the above-mentioned challenges tend to increase the complexity and cost of manufacturing high-frequency wireless communication assemblies.

SUMMARY

According to an aspect of the specification, a wireless communication assembly is provided, comprising: a first support member carrying a baseband processor and a radio processor connected to the baseband processor; the first support member defining a first mounting surface including a first pair of electrical contacts; the first support member having a first pair of electrical connections between the radio processor and the first pair of electrical contacts; and a second support member carrying an antenna and defining a second mounting surface including a second pair of electrical contacts; the second support member having a second pair of electrical connections between the antenna and the second pair of electrical contacts; the second mounting surface configured to engage with the first mounting surface to rigidly couple the first and second support members and to bring the first pair of electrical contacts into contact with the second pair of electrical contacts for electrically connecting the radio processor and the antenna via the first and second pairs of electrical connections.

BRIEF DESCRIPTIONS OF THE DRAWINGS

Embodiments are described with reference to the following figures, in which.

Figure 2A:
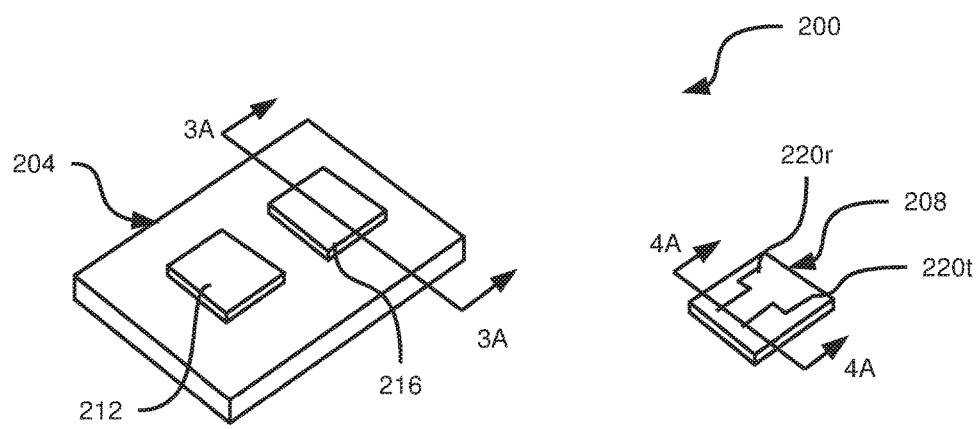
FIGS. 2A and 2B depict opposing sides of two support members of a wireless communication assembly, according to a non-limiting embodiment.
Figure 2B:
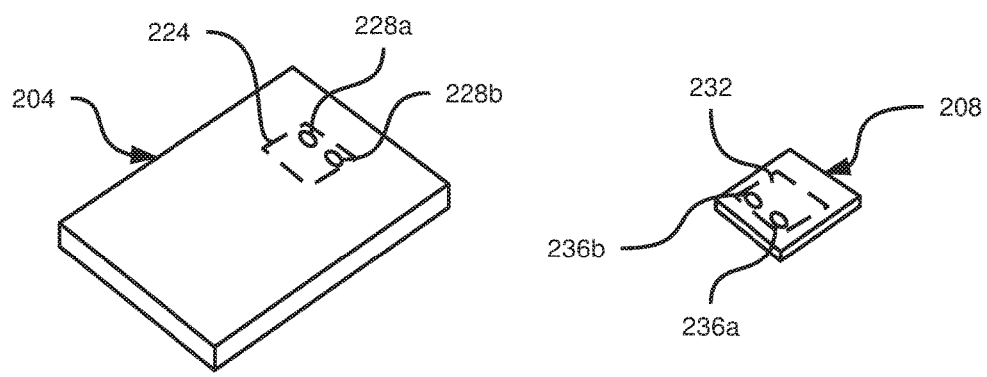
Figure 6A:
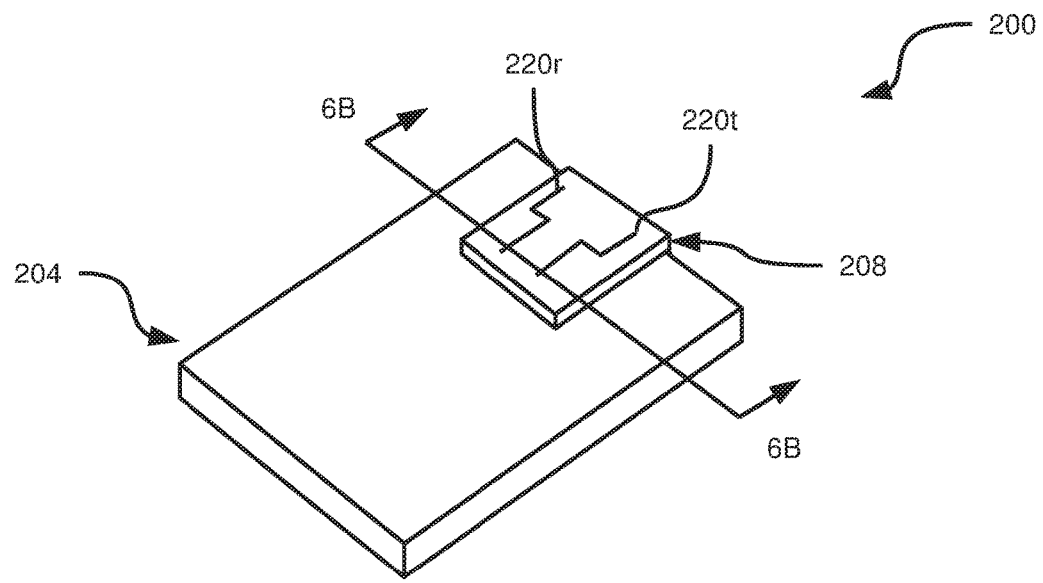
Figure 6B:
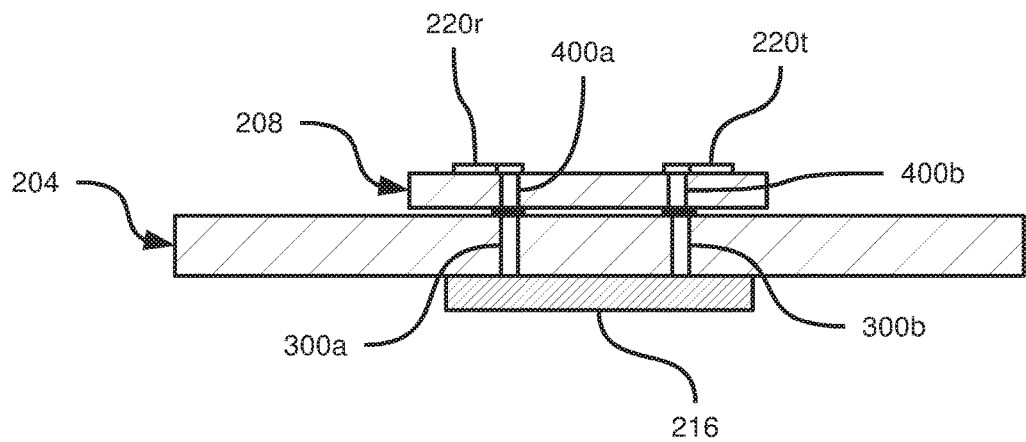
Figure 7A:
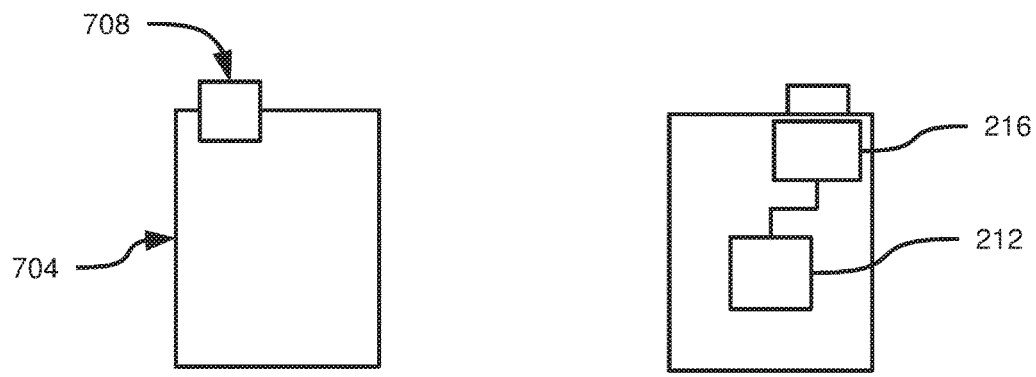
Figure 7B:
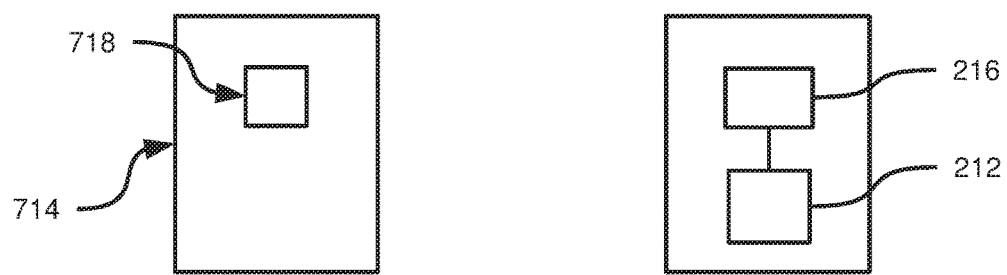

FIG. 6A depicts the wireless communication assembly of FIGS. 2A and 2B in an assembled state, according to a non-limiting embodiment FIG. 6B depicts a cross section of the wireless communication assembly of FIG. 6A, according to a non-limiting embodiment; and FIGS. 7A and 7B depict alternative form factors for the wireless communication assembly of FIGS. 2A and 2B, according to a non-limiting embodiment.

DETAILED DESCRIPTION OF THE EMBODIMENTS

Figure 1:
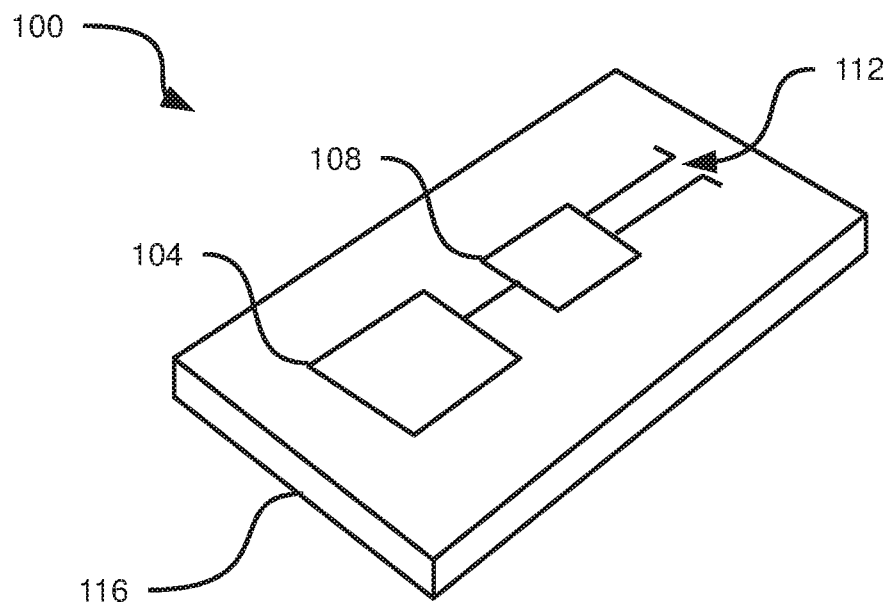
FIG. 1 depicts a wireless communications assembly, according to the prior art.

FIG. 1 depicts a wireless communications assembly 100 according to the prior art. Assembly 100 includes a baseband processor 104 and a radio processor 108, as well as an antenna 112. The above-mentioned components are carried on a support 116 such as a printed circuit board (PCB). In general, although the orientation of the components shown in FIG. 1 may vary, and although various other components (not shown) may also be included, all three of the baseband processor 104, radio processor 108 and antenna 112 are carried on the same support 116.

Turning now to FIG. 2A, a wireless communications assembly 200 (also referred to herein simply as "assembly 200") according to embodiments of the present invention is illustrated. Assembly 200 includes two physically distinct components: a first support member 204, which may also be referred to as a base board, and a second support member 208, which may also referred to as an antenna board.

First support member 204 is, in the present embodiment, a printed circuit board (PCB) carrying a plurality of components and circuit geometries, including a baseband processor 212 and a radio processor 216. A variety of other components may also be included within or on first support member 204, but are not directly relevant to the present discussion, and are therefore not illustrated for simplicity. Such components can include components supporting or otherwise directly associated with baseband processor 212 and radio processor 216. Such components can also include, in some embodiments, components not directly supporting or associated with those mentioned above (for example, baseband processor 212 and radio processor 216 can be components on a larger support member that fulfills a variety of functions beyond the wireless transmission and reception discussed herein). Further, as will now be apparent to those skilled in the art, first support member 204 can be implemented as any suitable type of PCB, or indeed with any other suitable support materials and associated manufacturing processes. Processors 212 and 216 are connected to one another, for example via circuit traces in PCB 204 (not shown in FIG. 2A). In the present example, processor 212 and 216 are integrated circuits and can be mounted on PCB 204 by any suitable mechanism (e.g. ball grid array (BGA) and the like). In some embodiments, processors 212 and 216 can be integrated with each other (that is, replaced by a single processor).

Second support member 208 is also a PCB in the present embodiment. PCB 208 carries an antenna comprising a transmission element 220*t* and a reception element 220*r* (collectively referred to as antenna 220). Antenna 220 can have any of a wide variety of geometries in addition to that shown in FIG. 2A, and in the present example is constructed of circuit traces on a surface of PCB 208.

In general, radio processor 216 is an interface between baseband processor 212 and antenna 220. Thus, incoming signals are detected at antenna 220 and provided to radio processor 216 via structural elements to be discussed in greater detail below. Radio processor 216, in turn, generates processed signal data and transmits the data to baseband processor 212 for further processing. Baseband processor 212 can transmit further processed data to other components (not shown) via one or more interface components supported on PCB 204, such as a Universal Serial Bus (USB) port (not shown) connected to baseband processor 212.

Outgoing signals, meanwhile, follow the reverse of the path described above: based on data received, for example, via the above-mentioned interface component, baseband processor generates intermediate transmission data and provides the intermediate transmission data to radio processor 216. Radio processor 216, in turn, generates transmission data and controls antenna 220 (specifically, element 220*t*) to emit signals representing the transmission data.

As shown in FIG. 2A, in the present embodiment, second support member 208 carries only antenna 220. That is, no other discrete components are carried by second support member 208, and second member 208 includes only those circuit traces required to implement antenna 220 and connect antenna 220 to first support member 204 via the structures to be described herein.

In other embodiments, second support member 208 can support components in addition to antenna 220. However, it is contemplated that even in such other embodiments, radio processor 216 and baseband processor 212 and their associated traces and components are supported not on second support member 208, but on first support member 204. In other words, it is contemplated that processors 212 and 216 are carried by a support member separate and distinct from the support member carrying antenna 220.

It will now be apparent to those skilled in the art that in operation, antenna 220 is connected to radio processor 216. Given that antenna 220 and radio processor 216 reside on separate support members, support members 204 and 208 each include mounting structures for establishing the connection between antenna 220 and radio processor 216.

Referring now to FIG. 2B, support members 204 and 208 are shown as viewed from the sides opposite to those shown in FIG. 2A. That is, if the surfaces supporting processors 212 and 216, as well as antenna 220, are referred to as the "upper" surfaces of support members 204 and 208, FIG. 2B depicts the "lower" surfaces of support members 204 and 208.

As seen in FIG. 2B, support member 204 defines a first mounting surface 224 (indicated by dashed lines) including a first pair of electrical contacts 228*a* and 228*b* (collectively referred to as electrical contacts 228). Mounting surface 224 can be, but is not necessarily, visually or physically demarcated on support member 204 (beyond the presence of electrical contacts 228). As seen from FIGS. 2A and 2B, first mounting surface 224 lies substantially opposite radio processor 216 (that is, substantially underneath radio processor 216).

Support member 208 defines a second mounting surface 232 (indicated by dashed lines) including a second pair of electrical contacts 236*a* and 236*b* (collectively referred to as electrical contacts 236). As noted above in connection with first mounting surface 224, second mounting surface 232 can be but is not necessarily, visually or physically demarcated on support member 208. In some embodiments, the presence of electrical contacts 236 is sufficient to indicate the position of second mounting surface 232 on support member 208.

Figure 3A:
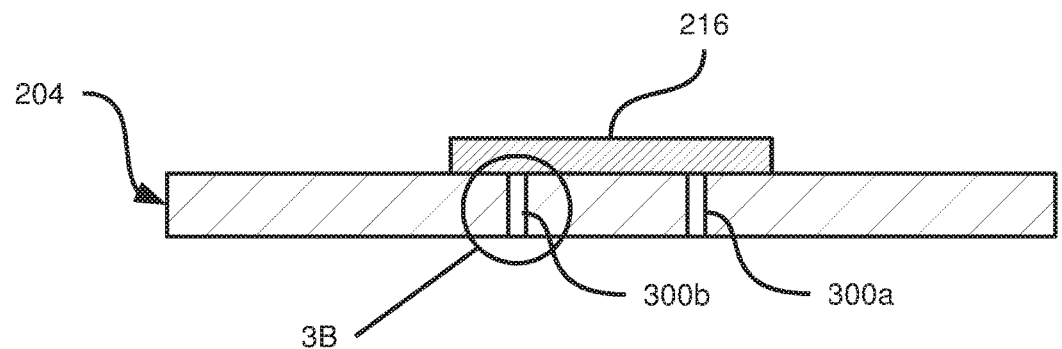
FIG. 3A depicts a cross section of the first support member of FIGS. 2A and 2B, according to a non-limiting embodiment.

Each of support members 204 and 208 also includes electrical connections, as will be described below in connection with FIGS. 3A and 3B as well as FIGS. 4A and 4B. Referring first to FIG. 3A, a cross-sectional view of first support member 204 taken from line 3A-3A in FIG. 2A is shown. Support member 204 includes a first pair of electrical connections 300*a* and 300*b* (collectively referred to as electrical connections 300) between radio processor 216 and first electrical contacts 228. More specifically, electrical connection 300*a* connects radio processor 216 with electrical contact 228*a*, and electrical connection 300*b* connects radio processor 216 with electrical contact 228*b*. In the present embodiment, electrical connections 300 are holes or vias extending through support member 204 from the side carrying radio processor 216 to the opposite side (that is, the side bearing first mounting surface 224).

Figure 3B:
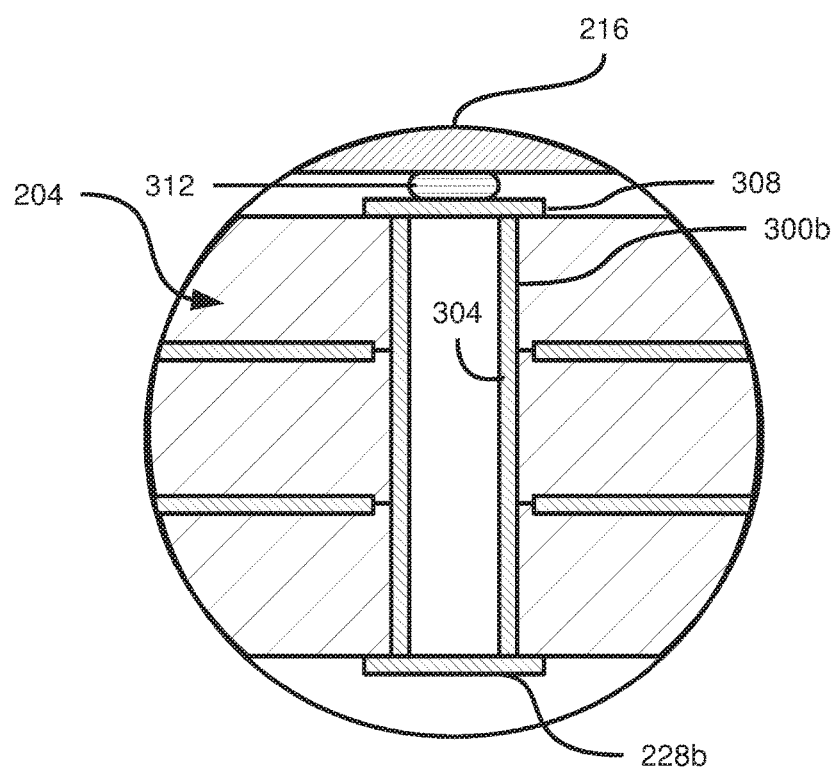
FIG. 3B depicts a detailed cross section of the portion of the first support member identified in FIG. 3A, according to a non-limiting embodiment.

Referring to the detail view shown in FIG. 3B, electrical connection 300*b* (the same features apply to electrical connection 300*a*) is a via drilled through first support member 204 and plated with a conductive material 304, such as copper. In the present embodiment, all vias are mechanically drilled. However, other processes may also be employed to create vias. The via may be filled with any of a variety of suitable materials (e.g. solder, epoxy and the like), but the filling is omitted from FIG. 3B for simplicity of illustration. Electrical connection 300*b* connects radio processor 216 to electrical contact 228*b*, which in the present embodiment is a conductive pad (e.g. of copper) on mounting surface 224. In other words, electrical connection 300*b* may be referred to as an "in pad" via. Radio processor 216 is shown connected to connection 300*b* via a pad 308 and a solder ball 312, although a wide variety of surface mounting technologies other than BGA may also be employed to couple radio processor 216 to support member 204 (e.g. pin grid array (PGA), land grid array (LGA) and the like).

It is also contemplated that electrical connection 300*b* traverses support member 204 without electrically connecting to any other components of support member 204. For example, as shown in FIG. 3B, support member 204 is a four-layer board (e.g. consisting of two double-sided copper-plated core members laminated on either side of a non-conductive pre-preg member). As illustrated, the copper layers (which can include ground planes, circuit traces and the like) do not contact electrical connection 300*b*.

Figure 4A:
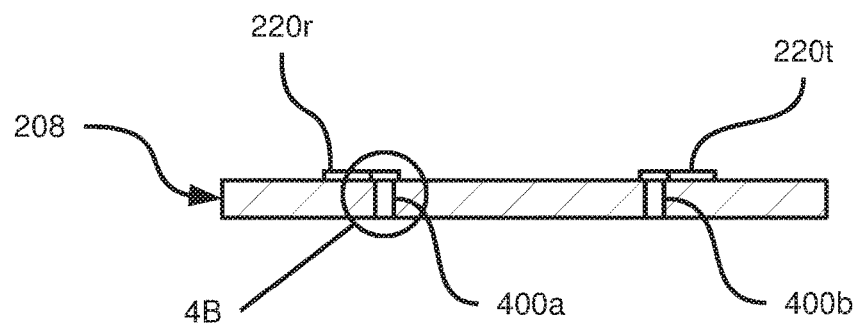
FIG. 4A depicts a cross section of the second support member of FIGS. 2A and 2B, according to a non-limiting embodiment.

Turning now to FIG. 4A, a cross section of second support member 208, taken at line 4A-4A labelled in FIG. 2A, is illustrated. As seen in FIG. 4A, second support member 208 includes a second pair of electrical connections 400*a* and 400*b* (collectively referred to as electrical connections 400) between antenna 220 and second electrical contacts 236. More specifically, electrical connection 400*a* connects antenna element 220*r* with electrical contact 236*a*, and electrical connection 400*b* connects antenna element 220*t* with electrical contact 236*b*.

In the present embodiment, electrical connections 400 are holes or vias extending through support member 208 from the side carrying antenna 220 to the opposite side (that is, the side bearing second mounting surface 232). As shown in the detail view of FIG. 4B, electrical connection 400*a* (connection 400*b* has the same features) comprises a hole drilled through second support member 208 and plated with a conductor 404 (e.g. copper). As seen in FIG. 4B, second support member 208 is a two-layer PCB, consisting of a single nonconductive layer with opposing surfaces thereof plated with conductive material such as copper. Antenna 220 can be etched from the conductive plating on one side of support member 208. Other manufacturing processes may also be employed to fabricate antenna 220 and the remainder of support member 208, including both subtractive processes such as etching (mentioned above) and additive processes.

In other embodiments, second support member 208 can include a greater number of conductive layers than two, and any of a variety of conventional support material constructions can be employed. For example, larger numbers of layers may be employed to support more complex antenna geometries. In such embodiments, connections 400 can traverse support member 208 without connecting to any intermediate conductive layers, as discussed above in connection with FIG. 3B.

Figure 4B:
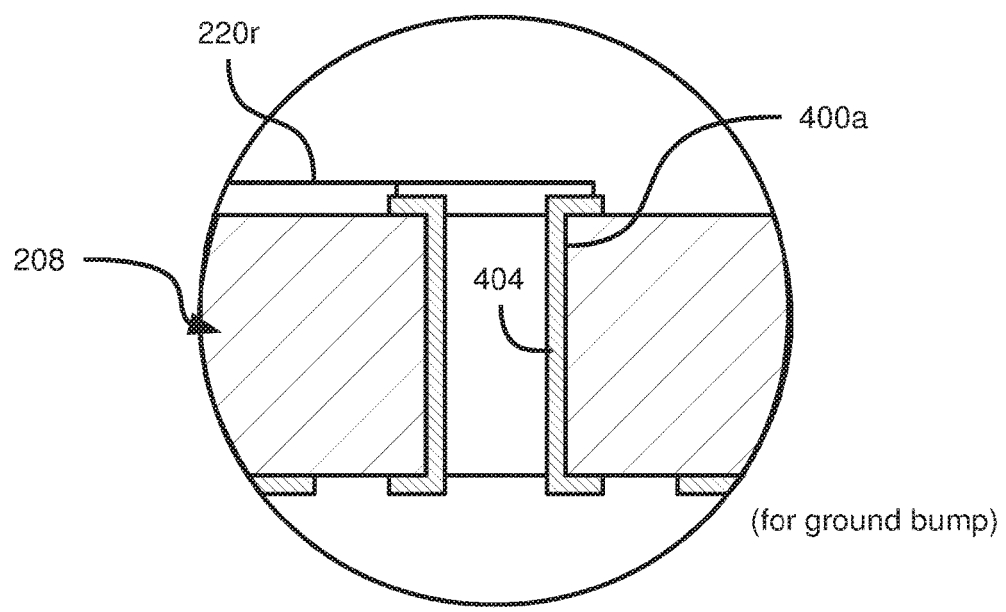
FIG. 4B depicts a detailed cross section of the portion of the second support member identified in FIG. 4A, according to a non-limiting embodiment.

It will be noted that electrical contact 236*a*, which corresponds to connection 400*a*, is not shown in FIG. 4B. A variety of electrical contacts are contemplated. In some embodiments the via of connection 400*a* may be filled and copper (or other conductive material) may be plated over the end of the via to provide electrical contact 236*a*, similarly to the implementation shown in FIG. 3B. In the present embodiment, however, as shown in FIGS. 5A and 5B, solder is employed to both fill the vias of electrical connections 400 and create electrical contacts 236.

Figure 5A:
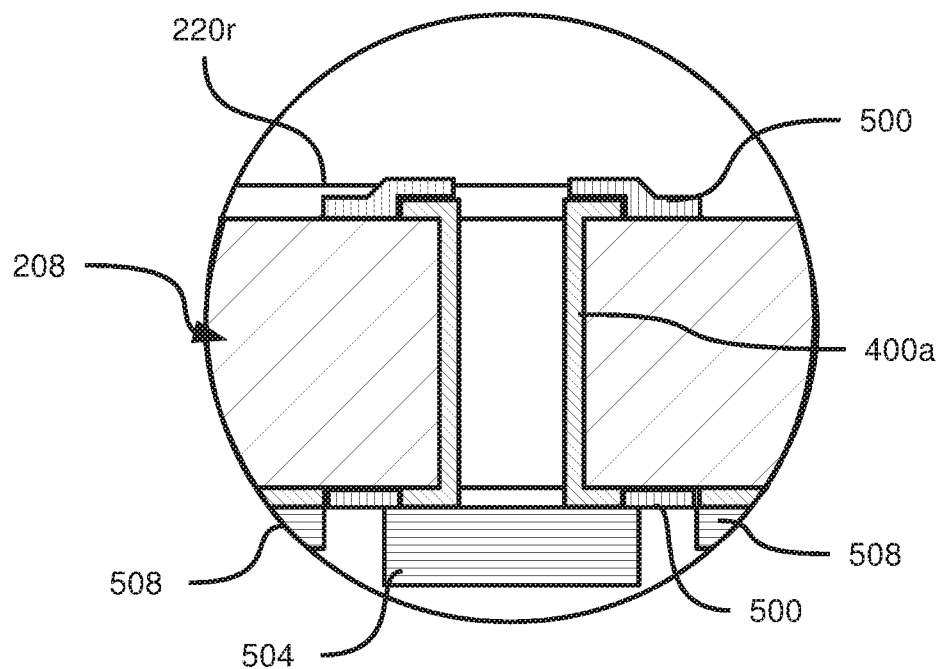
FIGS. 5A and 5B depict detailed cross sections of the portion of the second support member identified in FIG. 4A during manufacturing/assembly, according to a non-limiting embodiment.
Figure 5B:
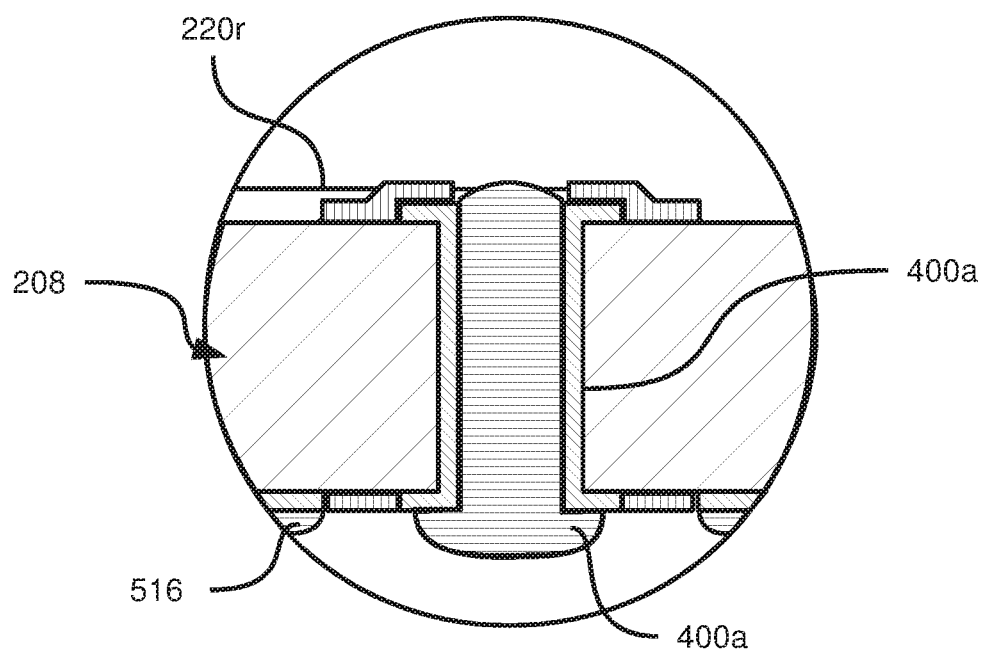

As shown in FIG. 5A, after the vias for connections 400 have been drilled and plated, solder mask 500 is deposited around the openings of the vias, and a deposit 504 of solder paste is applied (e.g. by silk-screening) over the opening of the vias on the side of support member 208 defining mounting surface 232. Additional deposits 508 of solder paste may also be placed on ground pads. Following the application of solder paste deposits 504 and 508, support member 208 is heated (e.g. via a reflow process). During the heating process, a portion of solder deposit 504 is drawn into the via of connection 400*a*, and the remainder forms a solder bump defining electrical connector 400*a*. Deposits 508, after reflow treatment, also form solder bumps 516 over the above-mentioned ground pads. In other words, the process described above simultaneously fills the via of connection 400*a* and forms a ball-grid array (BGA) mounting structure on mounting surface 232. Other fabrication processes may also be employed to produce support member 208 (e.g. to via fill and plate). Such processes may be performed at PCB fabrication instead of at the assembly stage.

Second mounting surface 232 is configured to engage with first mounting surface 224 to rigidly couple first support member 204 with second support member 208. Engagement of second mounting surface 232 with first mounting surface 224 also brings first electrical contacts 228 into contact with second electrical contacts 236 and thus electrically connects radio processor 216 with antenna 220. Specifically, receiving element 220*r* is connected to radio processor 216 via electrical connections 400*a* and 300*a*, while transmitting element 220*t* is connected to radio processor 216 via electrical connections 400*b* and 300*b*.

As will now be apparent to those skilled in the art, the mechanism of engagement between first and second mounting surfaces 224 and 232 is dependent on the nature of the electrical contacts 228 and 236. In the embodiments described above, in which contacts 228 are conductive pads and contacts 236 form a ball grid array, engagement between first and second mounting surfaces 224 and 232 is provided by placing second support member 208 (either manually or via an automated placement tool) on first support member 204 such that the mounting surfaces 224 and 232 are aligned. It will now be apparent to those skilled in the art that the use of BGA surface-mount package style lands on the first mounting surface and BGA surface-mount lands with preformed solder bumps on the second mounting surface, like those similar to those used on BGA surface-mount packages, ensure the second support member self-centers and aligns during reflow operations of the complete assembly.

Following placement of second support member 208 on first support member 204, the assembled support members are subjected to a reflow operation to melt the solder balls on second support member 208 (shown in FIG. 5B) and fix second support member 208 to first support member 204. FIGS. 6A and 6B depict assembly 200 in the assembled state, after first support member 204 and second support member 208 have been rigidly coupled. As best seen in FIG. 6B, second support member 208 is coupled to first support member 204 such that radio processor 216 and second support member 208 lie on substantially opposite portions of first support member 204. More specifically, electrical connections 300*a* and 400*a* are axially aligned and connected via electrical contacts 228*a* and 236*a* to connect antenna 220 with radio processor 216. Electrical connections 300*b* and 400*b* are similarly axially aligned and connected.

Various other mechanisms for rigidly coupling first and second support members 204 and 208 are contemplated. In addition to BGA and its variants, second support member 208 can also be coupled to first support member via pin-based surface mount structures, including pin grid array (PGA), land grid array (LGA) and the like. In other embodiments, castellation may be employed to connect first and second support members 204 and 208. In such embodiments, an edge of second support member 208 is castellated such that electrical connections 400*a* and 400*b* are open channels defining castellations. The application of solder within the castellations after placement of second support member 208 on first support member 204 serves to couple the support members.

In some embodiments, including the BGA-based embodiments discussed above, second support member 208 can be removed from first support member 204, for example to permit a different antenna board to be employed on the same base board. When the coupling between support members 204 and 208 is BGA-based, the removal of second support member 208 is accomplished by heating assembly 200 to melt the solder balls, upon which the solder can be cleaned from first support member 204.

Turning now to FIGS. 7A and 7B, other example form factors for assembly 200 are also contemplated. Each of FIG. 7A and 7B depicts opposing sides of an example variation of assembly 200. FIG. 7A, for example, depicts a first support member 704 coupled to a second support member 708 such that second support member 708 hangs over an edge of first support member 704. Radio processor 216 is placed on the opposite side of first support member 704 from second support member. The example of FIG. 7B, in contrast, places a second support member 718 within the edges of a first support member 714; radio processor 216 is located accordingly, to remain opposite second support member 718. In general, it will now be apparent to those skilled in the art that a wide variety of form factors can be employed to couple the antenna and base boards described herein.

Various advantages to the assemblies described above will now be apparent to those skilled in the art. For example, the physical separation of antenna 220 from the board carrying processors 212 and 216 may allow the base boards to be manufactured with relaxed tolerances, and may also allow less costly manufacturing for the antenna boards, as meeting required tolerances is less difficult when fewer components and circuit traces are present. The separation of boards as described above may also permit each board to be manufactured with a smaller number of layers than would be required to manufacture a single board carrying all components. Reducing the number of layers may reduce or eliminate the need for various processes that can introduce deviations from specified dimensions. For example, the need for laser drilling processes may be eliminated, allowing mechanical drilling to be employed for vias (which is generally less costly and produces vias with more consistent barrel dimensions). As a result of the above-mentioned cost reductions in manufacturing, the design and prototyping cycle of each antenna design may be less costly and time-consuming, thus permitting a greater variety of antenna designs to be pursued with similar development resources.

Variations to the above are also contemplated, beyond those variations already mentioned. For example, in some embodiments, first support member 204 can include an internal layer reserved for an integrated antenna trace, and a blind via connecting radio processor 216 with that layer. The above-mentioned reserved layer and blind via can be included in addition to the electrical connections, mounting surfaces and contacts described above. Thus, a single base board design can be used in conjunction with physically separate antennas (i.e. on second support member 208), but is also amenable to incorporating a selected antenna design on the reserved layer, without requiring relocation of the other components of the base board.

In further variations, a single first support member can carry a plurality of second support members (i.e. a plurality of antennas). In still further variations, a first support member each carrying respective radio and baseband processors (or multiple first support members each carrying a radio and baseband processor) can carry a single second support member (i.e. a single antenna). More generally, the ratio between first and second support members need not be one-to-one. In still further variations, baseband processor 212 need not be located on the same support member as radio processor 216. For example, in some embodiments, baseband processor 212 can be located on a further support member that is electrically connected to first support member 204.

Other variations will also occur to those skilled in the art in light of the above description. The scope of the claims should not be limited by the embodiments set forth in the above examples, but should be given the broadest interpretation consistent with the description as a whole.

I claim:

1. A wireless communication assembly, comprising:
    a first support member having an outer surface; the first support member defining a first mounting surface opposite the outer surface, the first mounting surface including a first pair of electrical contacts;
    a baseband processor surface-mounted to the outer surface;
    a radio processor connected to the baseband processor and surface-mounted to the outer surface;
    the first support member having a first pair of electrical connections extending from the outer surface through the first support member to the mounting surface, to electrically connect the radio processor and the first pair of electrical contacts; and
    a second support member carrying an antenna and defining a second mounting surface on an opposite side of the second support member from the antenna, the second mounting surface including a second pair of electrical contacts; the second support member having a second pair of electrical connections between the antenna and the second pair of electrical contacts;
    the second mounting surface configured to engage with the first mounting surface to rigidly couple the first and second support members and to bring the first pair of electrical contacts into contact with the second pair of electrical contacts for electrically connecting the radio processor and the antenna via the first and second pairs of electrical connections.

2. The wireless communication assembly of claim 1, the first pair of electrical connections comprising vias extending through the first support member, from the outer surface to the first mounting surface.

3. The wireless communication assembly of claim 2, wherein the vias are orthogonal to the outer surface.

4. The wireless communication assembly of claim 3, the second pair of electrical connections comprising vias extending through the second support member, from the side of the second support member carrying the antenna to the second mounting surface.

5. The wireless communication assembly of claim 4, wherein the vias are orthogonal to the side of the second support member carrying the antenna.

6. The wireless communication assembly of claim 5, the second pair of electrical contacts comprising solder bumps forming a ball grid array (BGA).

7. The wireless communication assembly of claim 1, the first support member comprising a multi-layer printed circuit board (PCB) and including:
    a reserved internal layer for an integrated antenna; and
    an additional electrical connection between the radio processor and the reserved internal layer.

8. An antenna component for a wireless communications assembly, comprising:
    an antenna support member carrying an antenna and defining a mounting surface on an opposite side of the antenna support member from the antenna, the mounting surface including a pair of electrical contacts;
    the antenna support member having a pair of electrical connections between the antenna and the pair of electrical contacts, the electrical connections comprising vias extending through the antenna support member, from a side of the antenna support member carrying the antenna to the mounting surface;

the mounting surface configured to engage with a corresponding mounting surface of a base component of the wireless communications assembly, to rigidly couple the antenna support member with the base component, and to bring the pair of electrical contacts into contact with a corresponding pair of electrical contacts on the base component for electrically connecting a radio processor surface-mounted on an opposite side of the base component from the corresponding pair of electrical contacts with the antenna via the pair of electrical connections.

9. The antenna component of claim 8, wherein the vias are orthogonal to the side of the antenna support member carrying the antenna.

10. The antenna component of claim 9, the pair of electrical contacts comprising solder bumps forming a ball grid array (BGA).

11. A base component for a wireless communications assembly, comprising:
- a base support member having an outer surface; the base support member defining a mounting surface opposite the outer surface, the mounting surface including a pair of electrical contacts;
- a baseband processor surface-mounted to the outer surface;
- a radio processor connected to the baseband processor and surface-mounted to the outer surface;
- the base support member having a pair of electrical connections extending from the outer surface through the first support member to the mounting surface, to electrically connect the radio processor and the pair of electrical contacts;
- the mounting surface configured to engage with a corresponding mounting surface of an antenna component of the wireless communications assembly, to rigidly couple the antenna component with the base support member, and to bring the pair of electrical contacts into contact with a corresponding pair of electrical contacts on the corresponding mounting surface of the antenna component for electrically connecting the radio processor with an antenna carried by the antenna component on an opposite side of the antenna component from the corresponding pair of electrical contacts via the pair of electrical connections.

12. The base component of claim 11, the pair of electrical connections comprising vias extending through the base support member, from the outer surface to the mounting surface.

13. The base component of claim 12, wherein the vias are orthogonal to the outer surface.

14. The base component of claim 11, the base support member comprising a multi-layer printed circuit board (PCB) and including:
- a reserved internal layer for an integrated antenna; and
- an additional electrical connection between the radio processor and the reserved internal layer.

* * * * *